United States Patent
Cho

(10) Patent No.: US 8,531,016 B2
(45) Date of Patent: Sep. 10, 2013

(54) THERMALLY ENHANCED SEMICONDUCTOR PACKAGE WITH EXPOSED PARALLEL CONDUCTIVE CLIP

(75) Inventor: Eung San Cho, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 13/111,812

(22) Filed: May 19, 2011

(65) Prior Publication Data

US 2012/0292752 A1  Nov. 22, 2012

(51) Int. Cl.
*H01L 23/495* (2006.01)

(52) U.S. Cl.
USPC .......................................... 257/675

(58) Field of Classification Search
CPC ............ H01L 2224/48247; H01L 2224/48091
USPC .................. 257/675, 678, E23/101
See application file for complete search history.

(56) References Cited

U.S. PATENT DOCUMENTS

| 6,566,164 | B1 | 5/2003 | Glenn et al. | |
| 6,677,669 | B2* | 1/2004 | Standing | 257/685 |
| 6,777,800 | B2* | 8/2004 | Madrid et al. | 257/690 |
| 2004/0104489 | A1* | 6/2004 | Larking | 257/787 |
| 2005/0161785 | A1 | 7/2005 | Kawashima | |
| 2005/0206010 | A1* | 9/2005 | Noquil et al. | 257/778 |
| 2008/0012045 | A1 | 1/2008 | Muto | |
| 2008/0036078 | A1 | 2/2008 | Herbsommer | |
| 2010/0127365 | A1 | 5/2010 | Galera | |
| 2010/0176508 | A1 | 7/2010 | Herbsommer | |

* cited by examiner

*Primary Examiner* — Nikolay Yushin
(74) *Attorney, Agent, or Firm* — Farjami & Farjami LLP

(57) ABSTRACT

One exemplary disclosed embodiment comprises a semiconductor package including an inside pad, a transistor, and a conductive clip coupled to the inside pad and a terminal of the transistor. A top surface of the conductive clip is substantially exposed at the top of the package, and a side surface of the conductive clip is exposed at a side of the package. By supporting the semiconductor package on an outside pad during the fabrication process and by removing the outside pad during singulation, the conductive clip may be kept substantially parallel and in alignment with the package substrate while optimizing the package form factor compared to conventional packages. The exposed top surface of the conductive clip may be further attached to a heat sink for enhanced thermal dissipation.

20 Claims, 7 Drawing Sheets

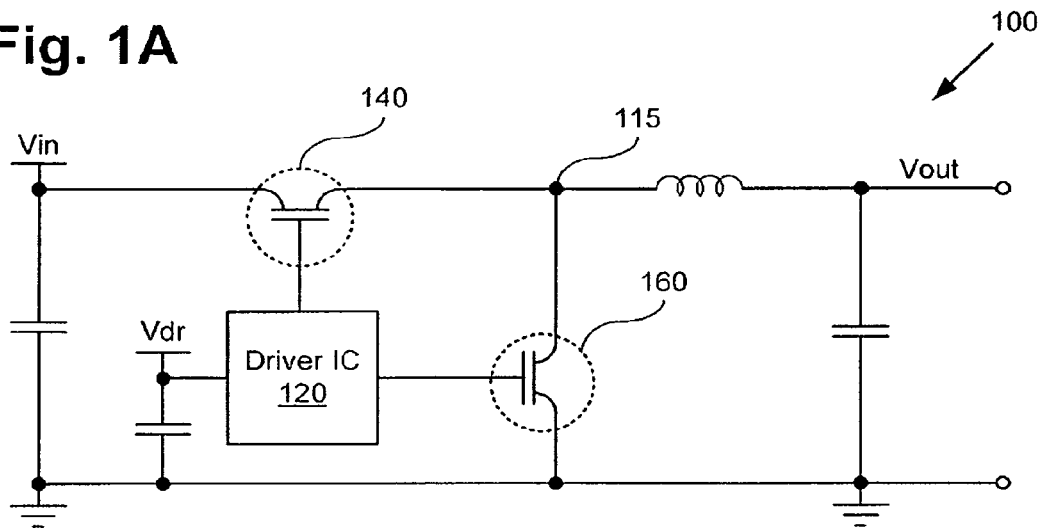
Fig. 1A
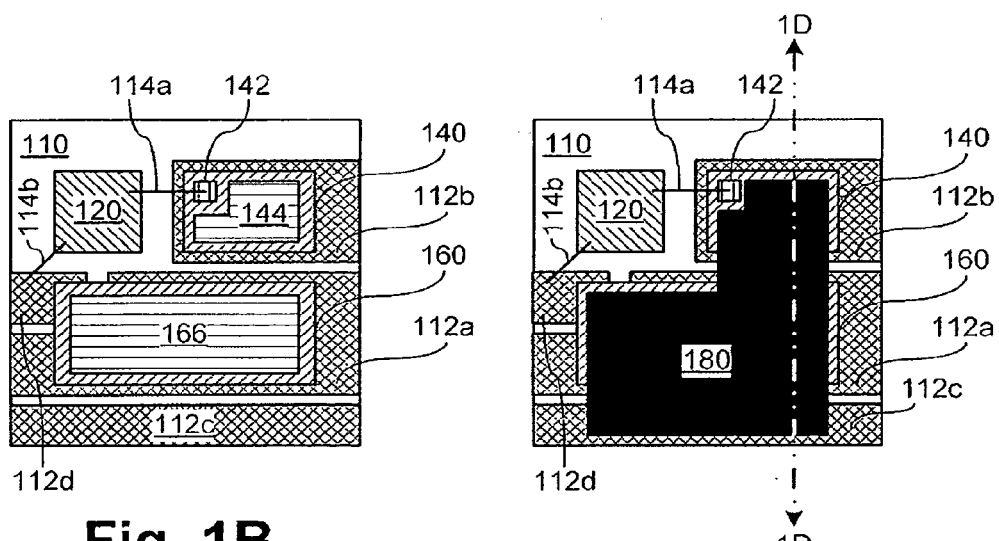
Fig. 1B
(Prior Art)
Fig. 1C
(Prior Art)

Fig. 1D
(Prior Art)
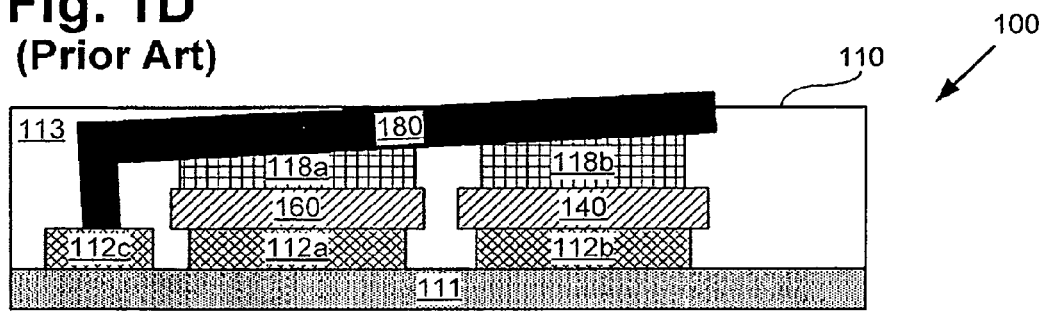
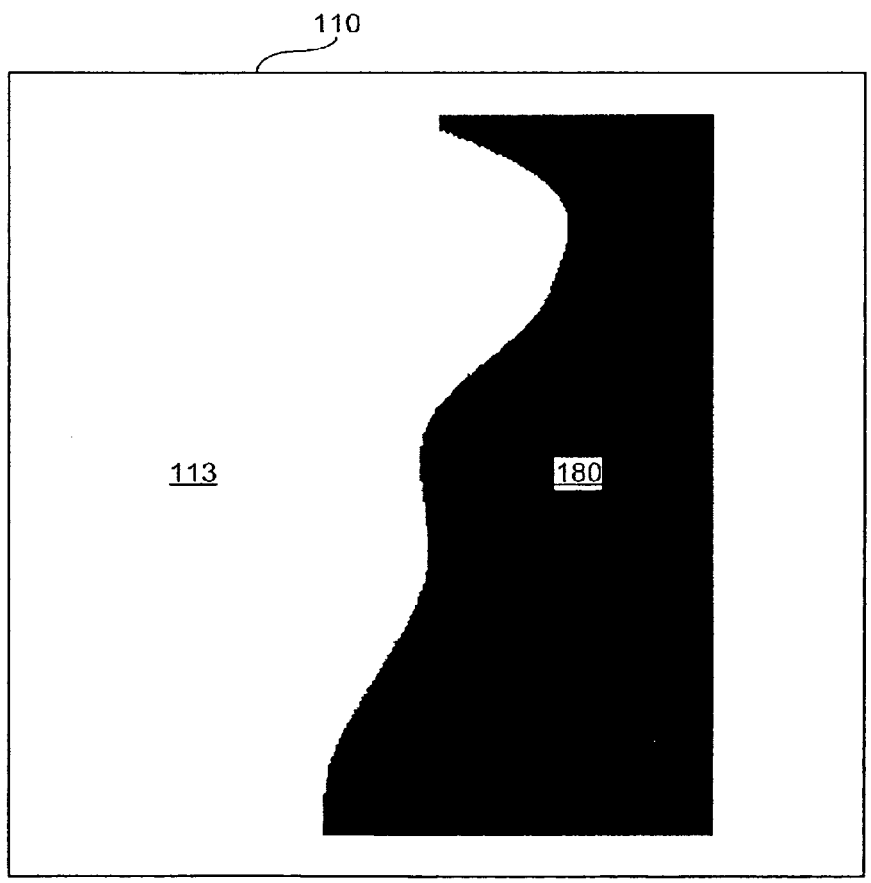
Fig. 1E
(Prior Art)

THERMALLY ENHANCED SEMICONDUCTOR PACKAGE WITH EXPOSED PARALLEL CONDUCTIVE CLIP

BACKGROUND OF THE INVENTION

1. Field of the Invention

The present invention relates generally to semiconductor devices. More particularly, the present invention relates to packaging of semiconductor devices.

2. Background Art

For optimization of form factor, performance, and manufacturing cost, it is often desirable to integrate the components of a power circuit, such as a half-bridge based DC-DC converter or buck converter, into a single compact package. Thus, several package designs, including quad flat no leads (QFN) packages, have been developed to integrate several transistors within a single compact package. To provide sufficient electrical performance for the reliable operation of high power semiconductor packages, it is crucial to ensure high current carrying capacity and low resistance between transistors within the package. Additionally, for long-term package reliability, it is essential to provide proper thermal dissipation.

It is known to use a conductive clip to provide a high performance interconnect between transistors and input/output terminals within a package. Additionally, by exposing the conductive clip to the outside of the package, enhanced thermal dissipation may be provided, for example by affixing a heat sink to the exposed area of the conductive clip.

Unfortunately, conventional assembly processes may result in the tilting of the conductive clip. More specifically, since the conductive clip is conventionally supported on a single side of the package, the conductive clip tends to tilt inwards or outwards from the package molding, thus incompletely exposing the conductive clip and reducing yield. While it is possible to support the conductive clip on multiple areas of the package to reduce the incidence of such tilting, such a design undesirably increases the package form factor and cost.

Thus, a cost-effective solution is needed to support the efficient design and operation of high power semiconductor packages with enhanced thermal dissipation and a compact form factor.

SUMMARY OF THE INVENTION

Thermally enhanced semiconductor package with exposed parallel conductive clip, substantially as shown in and/or described in connection with at least one of the figures, and as set forth more completely in the claims.

BRIEF DESCRIPTION OF THE DRAWINGS

FIG. 1A illustrates a circuit diagram of a buck converter using a half-bridge topology.

FIG. 1B illustrates a top view of a conventional semiconductor package.

FIG. 1C illustrates a top view of a conventional semiconductor package with a conductive clip.

FIG. 1D illustrates a cross sectional view of a portion of a conventional semiconductor package with a conductive clip tilted outward.

FIG. 1E illustrates a top view of a conventional semiconductor package with a conductive clip tilted outward.

DETAILED DESCRIPTION OF THE INVENTION

Figure 1F:
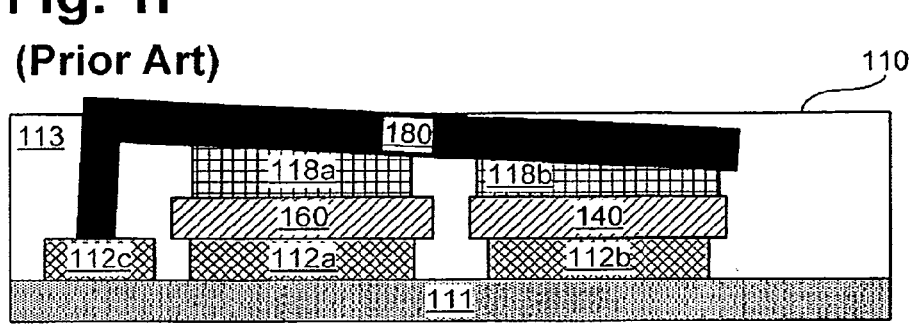
FIG. 1F illustrates a cross sectional view of a portion of a conventional semiconductor package with a conductive clip tilted inward.

The present application is directed to a thermally enhanced semiconductor package with exposed parallel conductive clip. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

FIG. 1A illustrates a circuit diagram of a buck converter using a half-bridge topology. Diagram 100 includes switched node 115, driver integrated circuit (IC) 120, control transistor 140 (also referred to as a "control switch" or a "control FET"), and synchronous transistor 160 (also referred to as a "synchronous switch," a "sync switch," a "synchronous FET," or a "sync FET"). The source of control transistor 140 is coupled to the drain of sync transistor 160 at switched node 115. Driver IC 120 operates on voltage Vdr and controls the duty cycles of control transistor 140 and sync transistor 160, thereby converting the input voltage Vin to a specific output voltage Vout. Control transistor 140 and sync transistor 160 may each comprise a conventional field effect transistor (FET) switch, for example a silicon FET. However, control transistor 140 and sync transistor 160 may each also comprise a non-silicon FET or any other FET in general. Alternatively, one or both of control transistor 140 and sync transistor 160 may also comprise a III-nitride depletion mode switch.

As discussed above, it may be desirable to implement a circuit, such as the circuit of diagram 100, in a compact and integrated package, such as a QFN package or another leadless package. Accordingly, turning to FIG. 1B, FIG. 1B illustrates a top view of a conventional semiconductor package. Diagram 100 of FIG. 1B includes package 110. Package 110 includes pads 112a, 112b, 112c and 112d, wirebonds 114a and 114b, driver IC 120, control transistor 140, and sync transistor 1.60. Package 110 may comprise, for example, a QFN package. Control transistor 140 is disposed on pad 112b and may comprise a three terminal transistor including a top surface having a control gate 142 and a control source 144, and a bottom surface having a control drain 146, hidden from view in FIG. 1B. Sync transistor 160 is disposed on pads 112a and 112d and may comprise a three terminal transistor including a top surface having a sync drain 166 and a bottom surface having a sync gate 162 and a sync source 164, hidden from view in FIG. 1B. Sync gate 162 may be coupled to pad 212d, and sync source 164 may be coupled to pad 212a. Driver IC 120 is electrically coupled to control gate 142 via wirebond 114a and to sync gate 162 through wirebond 114b connected to pad 112d. Although not shown in FIG. 1B, driver IC 120 may also be connected to several pads of package 110 for input/output.

FIG. 1C illustrates a top view of a conventional semiconductor package with a conductive clip. Comparing FIG. 1C with FIG. 1B, FIG. 1C adds a conductive clip 180 to package 110 of FIG. 1B. Conductive clip 180 is coupled to pad 112c, sync drain 166, and control source 144. Thus, the layout of package 110 in FIG. 1C connects driver IC 120, control transistor 140, and sync transistor 160 as shown in diagram 100 of FIG. 1A.

Unfortunately, the assembly and manufacture of package 110 as shown in FIG. 1C tends to result in the tilting of conductive clip 180, which undesirably results in the top surface of conductive clip 180 being only partially exposed to the outside of package 110. As previously noted, for high power semiconductor packages, it is particularly important to provide enhanced thermal dissipation for long-term reliability. Ideally, conductive clip 180 should be substantially parallel with the substrate of package 110 to completely expose a flat top surface of conductive clip 180 at the top of package 110. If conductive clip 180 is only partially exposed due to tilting, then package 110 may then no longer meet thermal dissipation requirements for a particular application, resulting in yield reduction and manufacturing cost increases.

The above described tilting problem is examined in more detail in FIGS. 1D through 1G. FIG. 1D illustrates a cross sectional view of a portion of a conventional semiconductor package with a conductive clip tilted outward. The cross section shown in FIG. 1D may correspond to the cross sectional line indicated by line 1D-1D of FIG. 1C. Pads 112a, 112b, and 112c are disposed on a substrate 111. Substrate 111 may comprise any supporting substrate such as, but not limited to, a printed circuit board (PCB), a ceramic substrate, direct bonded copper (DBC), or a leadframe. Control transistor 140 is disposed on pad 112b, and sync transistor 160 is disposed on pad 112a. Conductive clip 180 is coupled to sync drain 166 (not shown) of sync transistor 160 and control source 144 (not shown) of control transistor 140 through solder 118a and solder 118b, respectively. The package 110 is encapsulated in mold compound 113.

As shown in FIG. 1D, conductive clip 180 may tilt outwards from package 110 since it is only supported on pad 112c. While it is possible to support conductive clip 180 on additional pads placed on substrate 111, such an approach undesirably increases the form factor of package 110 without providing any functional purpose other than mechanically supporting conductive clip 180.

Turning to FIG. 1E, FIG. 1E illustrates a top view of a conventional semiconductor package with a conductive clip tilted outward. The top view of FIG. 1E may correspond to a top view of package 110 from FIG. 1D. As shown in FIG. 1E, conductive clip 180 is only partially exposed at the top of package 110, with a large portion of conductive clip 180 being buried by mold compound 113. As a result, thermal dissipation is negatively affected and the secure attachment of heat sinks may be difficult.

Addressing FIG. 1F, FIG. 1F illustrates a cross sectional view of a portion of a conventional semiconductor package with a conductive clip tilted inward. The cross section shown in FIG. 1F may correspond to the cross sectional line indicated by line 1D-1D of FIG. 1C. Thus, comparing FIG. 1F to FIG. 1D, only the tilt direction of conductive clip 180 differs, whereas the rest of package 110 is structured in a similar manner besides the shapes of solder 118a and 118b being affected by the tilting.

As shown in FIG. 1F, conductive clip 180 may tilt inwards into package 110 since it is only supported on pad 112c. As described above, while it is possible to support conductive clip 180 on additional pads placed on substrate 111, such an approach undesirably increases the form factor of package 110 without providing any functional purpose other than mechanically supporting conductive clip 180.

Figure 1G:
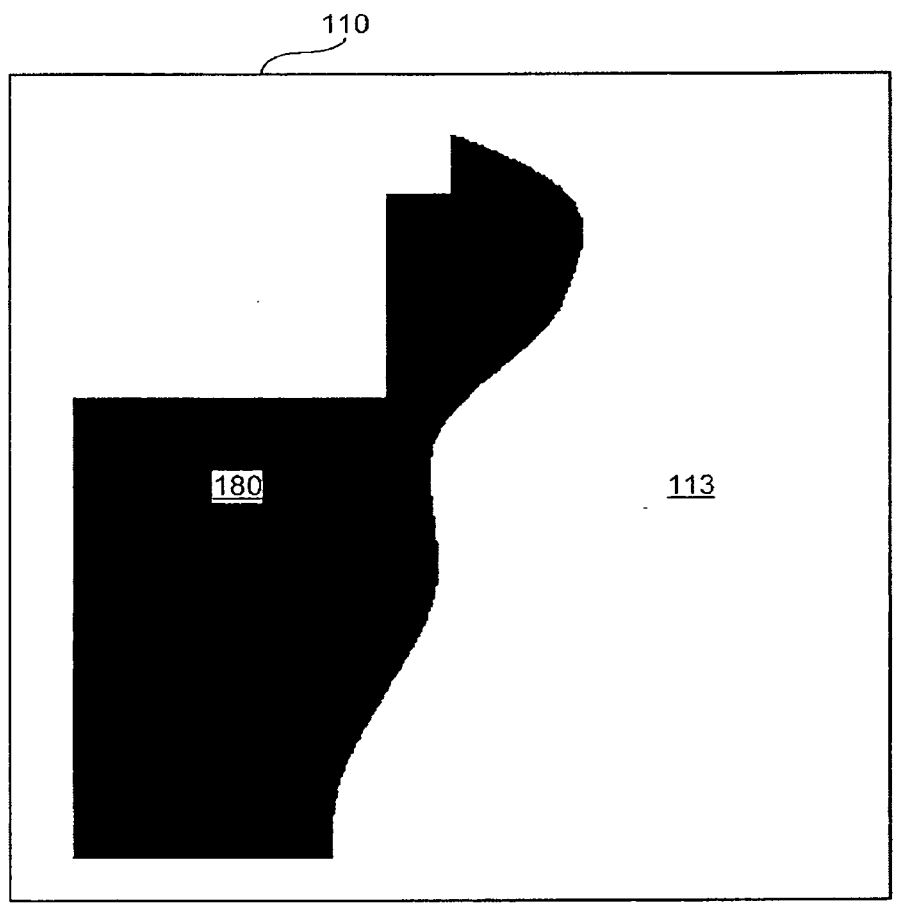
FIG. 1G illustrates a top view of a conventional semiconductor package with a conductive clip tilted inward.

With respect to FIG. 1G, FIG. 1G illustrates a top view of a conventional semiconductor package with a conductive clip tilted inward. The top view of FIG. 1G may correspond to a top view of package 110 from FIG. 1F. As shown in FIG. 1G, conductive clip 180 is only partially exposed at the top of package 110, with a large portion of conductive clip 180 being buried by mold compound 113. As a result, thermal dissipation is negatively affected and the secure attachment of heat sinks may he difficult.

Figure 1H:
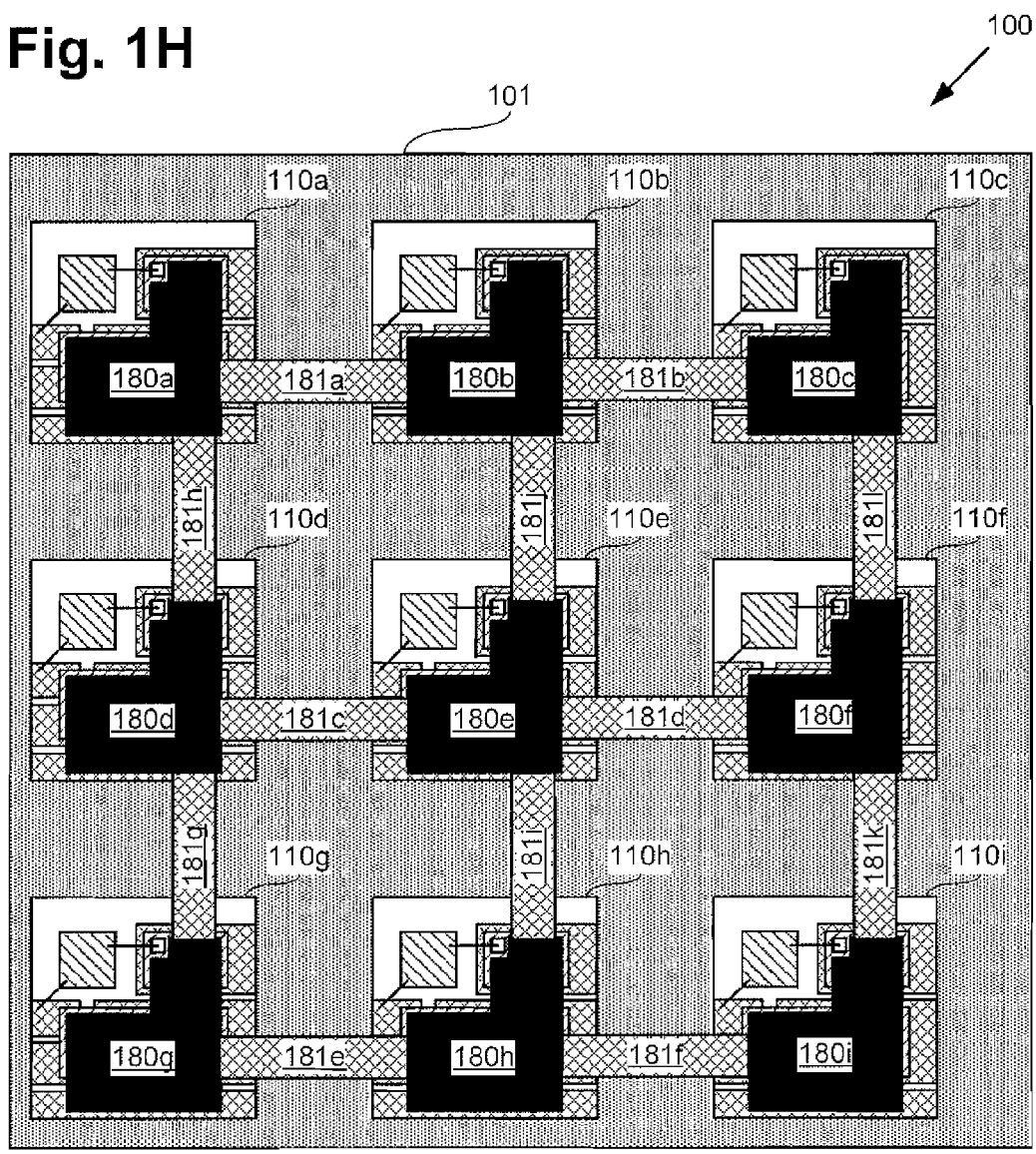
FIG. 1H illustrates a top view of a wafer having a plurality of conventional semiconductor packages with conductive clips connected by support bars.

Various approaches to mitigate the above tilting problem have been attempted with limited success. For example, FIG. 1H illustrates a top view of a wafer having a plurality of conventional semiconductor packages with conductive clips connected by support bars. Wafer 101 includes a plurality of individual packages including package 110a, 110b, 110c, 110d, 110e, 110f, 110g, 110h, and 110i, which each include a respective conductive clip 180a, 180b, 180c, 180d, 180e, 180f, 180g, 180h, and 180i. Each of packages 110a through 110i may correspond to package 110 from FIG. 1C. As shown in FIG. 1H, conductive clips 180a through 180i are linked together using support bars 181a, 181b, 181c, 181d, 181e, 181f, 181g, 181h, 181i, 181j, 181k, and 181l. While support bars 181a through 181l may provide some measure of mechanical support, the structure of wafer 101 shown in FIG. 1H is nevertheless extremely difficult to manufacture and still does not ensure that conductive clips 180a through 180i will necessarily remain parallel with their respective package substrates. Thus, the approach shown in FIG. 1H has low practical applicability due to high cost and complexity while demonstrating limited effectiveness.

Figure 2A:
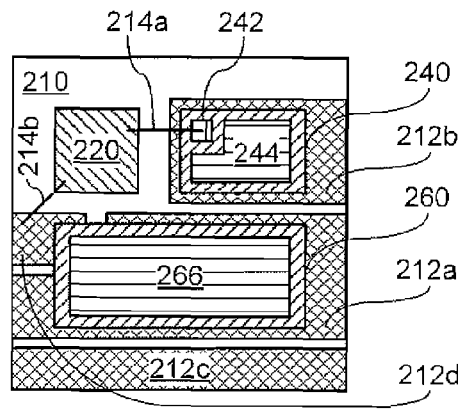
FIG. 2A illustrates a top view of a thermally enhanced semiconductor package according to an embodiment of the invention.

Turning to FIG. 2A, FIG. 2A illustrates a top view of a thermally enhanced semiconductor package according to an embodiment of the invention. Diagram 200 of FIG. 2A includes package 210, which may correspond to package 110 from FIG. 1B. Thus, package 110 may comprise a leadless package such as a QFN package, and driver IC 220, control transistor 240 and sync transistor 260 may be similarly configured as driver IC 120, control transistor 140 and sync transistor 160 from FIG. 1B. As shown in diagram 200 of FIG. 2A, control transistor 240 is placed on pad 212b while sync transistor 260 is placed on pads 212a and 212d. Pad 212c is not yet connected to anything in FIG. 2A. Wirebond 214a connects driver IC 210 to control gate 242, while wirebond 214b connects driver IC 210 to sync gate 262 (not shown) via pad 212d.

Figure 2B:
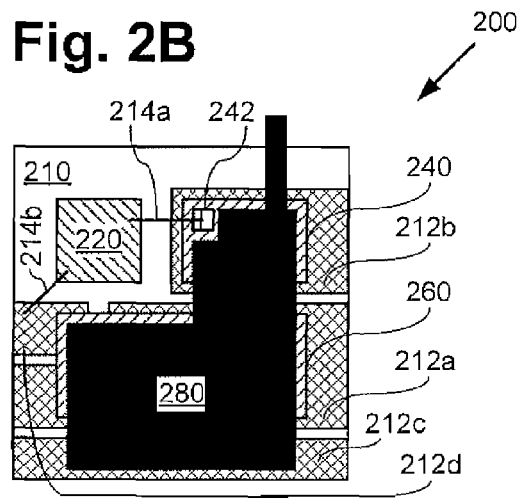
FIG. 2B illustrates a top view of a thermally enhanced semiconductor package with a conductive clip according to an embodiment of the invention.

Turning to FIG. 2B, FIG. 2B illustrates a top view of a thermally enhanced semiconductor package with a conductive clip according to an embodiment of the invention. Comparing FIG. 2B with FIG. 2A, FIG. 2B adds a conductive clip 280 to package 210 of FIG. 2A. Conductive clip 280 may comprise any highly conductive material, including a metal such as copper or a metallic alloy, and is coupled to pad 212c, sync drain 266, and control source 244, for example by solder, conductive adhesive, or another attach material. Thus, the layout of package 210 in FIG. 1C connects driver IC 220, control transistor 240, and sync transistor 260 as shown in diagram 100 of FIG. 1A. While the examples discussed in FIGS. 2A through 2I focus on an embodiment with two transistors and a driver IC in a buck converter circuit, alternative embodiments may more generally include, for example, a package having at least one transistor coupled to a conductive clip.

Comparing FIG. 2B with FIG. 1C, it can be observed that conductive clip 280 extends outside the boundaries of package 210 in FIG. 2B, whereas conductive clip 180 remains within the boundaries of package 110 in FIG. 1C. The specific structure of conductive clip 280 is further detailed below.

Figure 2C:
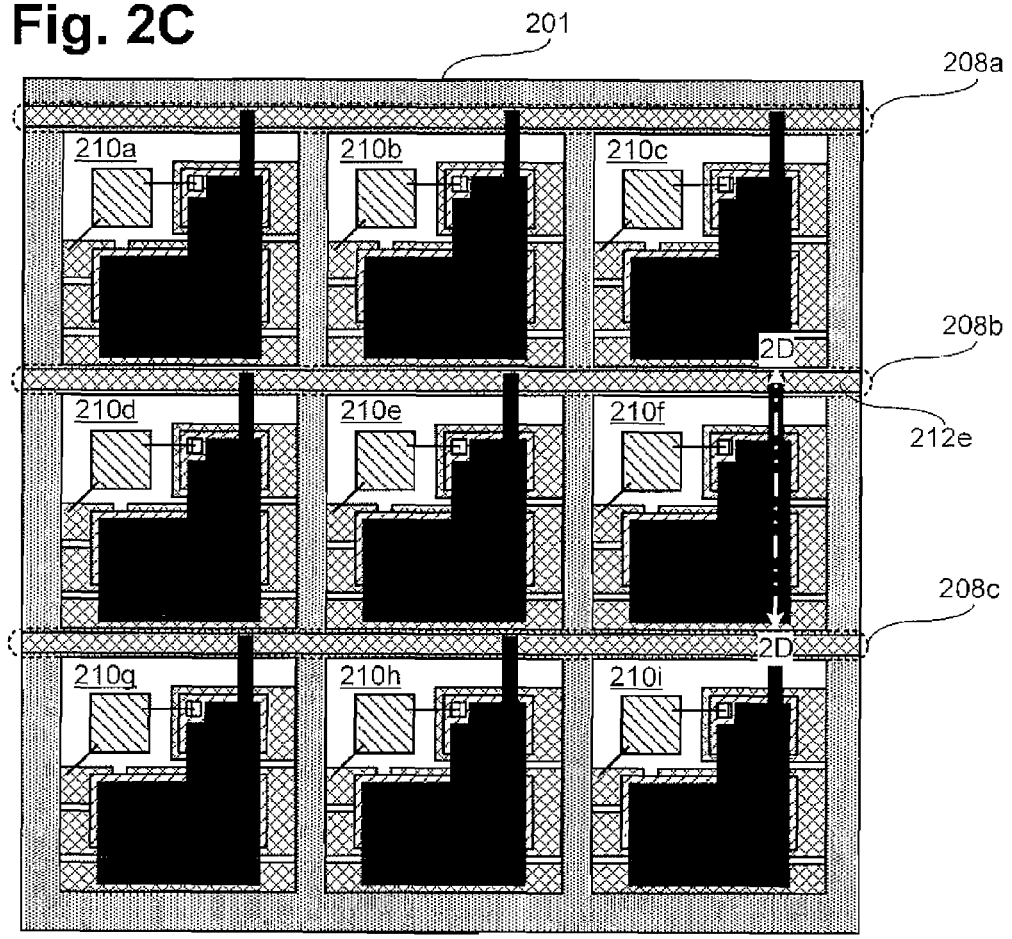
FIG. 2C illustrates a top view of a wafer having a plurality of thermally enhanced semiconductor packages according to an embodiment of the invention.

Discussing FIG. 2C, FIG. 2C illustrates a top view of a wafer having a plurality of thermally enhanced semiconductor packages according to an embodiment of the invention. Wafer 201 includes a plurality of individual packages including package 210a, 210b, 210c, 210d, 210e, 210f, 210g, 210h, and 210i. Each of packages 210a through 210i may correspond to package 210 from FIG. 2B. Regions 208a, 208b, and 208c are identified on wafer 201, with region 208b including a pad 212e. While not shown in FIG. 2C, similar regions of Y-axis separators may also extend between the packages. The X-axis separators, or regions 208a, 208b, 208c, and the Y-axis separators (not shown) may be cut or sawn at a later stage to singulate packages 210a through 210i.

Figure 2D:
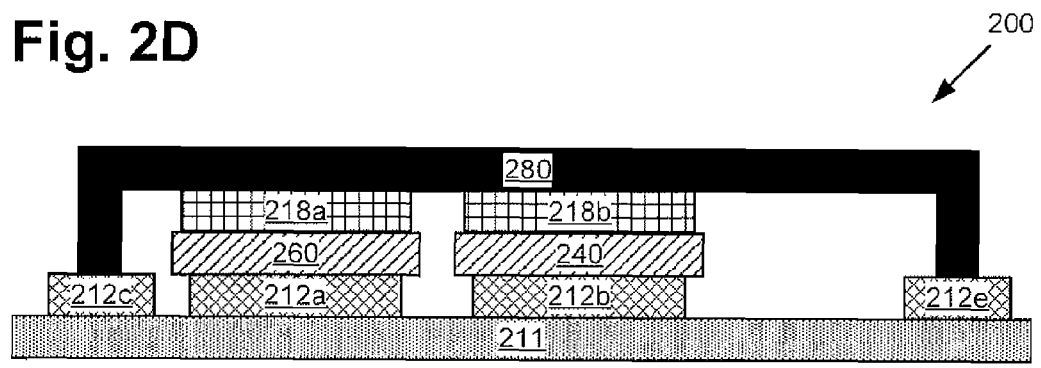
FIG. 2D illustrates a cross sectional view of a thermally enhanced semiconductor package according to an embodiment of the invention.

Moving to FIG. 2D, FIG. 2D illustrates a cross sectional view of a thermally enhanced semiconductor package according to an embodiment of the invention. The cross section shown in FIG. 2D may correspond to the cross sectional line indicated by line 2D-2D of FIG. 2C. Substrate 211 may comprise any supporting substrate such as, but not limited to, a printed circuit board (PCB), a ceramic substrate, direct bonded copper (DBC), or a leadframe. Pads 212a, 212b, 212c, and 212e are disposed on substrate 211. Substrate 211 houses sync transistor 260, which is disposed on pad 212a, and control transistor 240, which is disposed on pad 212b.

As shown in FIG. 2D, conductive clip 280 is coupled to sync drain 266 (not shown) of sync transistor 260 via solder 218a and to control source 244 (not shown) of control transistor 240 via solder 218b. Conductive clip 280 is further supported by coupling to pad 212c, also referred to as an "inside pad", and pad 212e, also referred to as an "outside pad". The terms "inside pad" and "outside pad" are relative to the package after singulation, with the "inside pad" remaining inside the package and the "outside pad" being outside the package. Since conductive clip 280 is supported by pads 212c and 212e on two sides, conductive clip 280 may remain substantially parallel to substrate 211 during and after assembly, thereby avoiding the risk of tilting as with conductive clip 180 in FIGS. 1D and 1F. Additionally, while conductive clip 280 is supported by a single inside pad and a single outside pad, as shown by pad 212c and pad 212e in FIGS. 2B and 2C respectively, alternative embodiments may use multiple inside pads and multiple outside pads. For example, pad 212c and/or pad 212e may be divided along the X-axis into multiple separate pads, or another multi-pad configuration may be utilized.

Figure 2E:
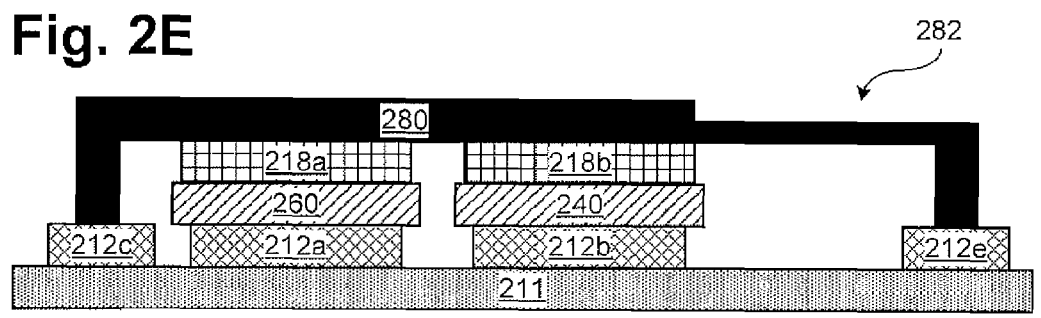
FIG. 2E illustrates a cross sectional view of a thermally enhanced semiconductor package according to an embodiment of the invention.

Turning to FIG. 2E, FIG. 2E illustrates a cross sectional view of a thermally enhanced semiconductor package according to an embodiment of the invention. Comparing FIG. 2E to FIG. 2D, conductive clip 280 is half-etched from a top surface of conductive clip 280 at portion 282. As shown in FIG. 2E, portion 282 is the portion of conductive clip 280 that extends to the side of the package and further couples to pad 212e, or the outside pad. This half-etching step may help to define the exposed surface of conductive clip 280, preventing accidental shorting and providing a uniform surface for heat sink mounting. However, the half-etching step is optional and fabrication of the package may skip the step shown in FIG. 2E.

Figure 2F:
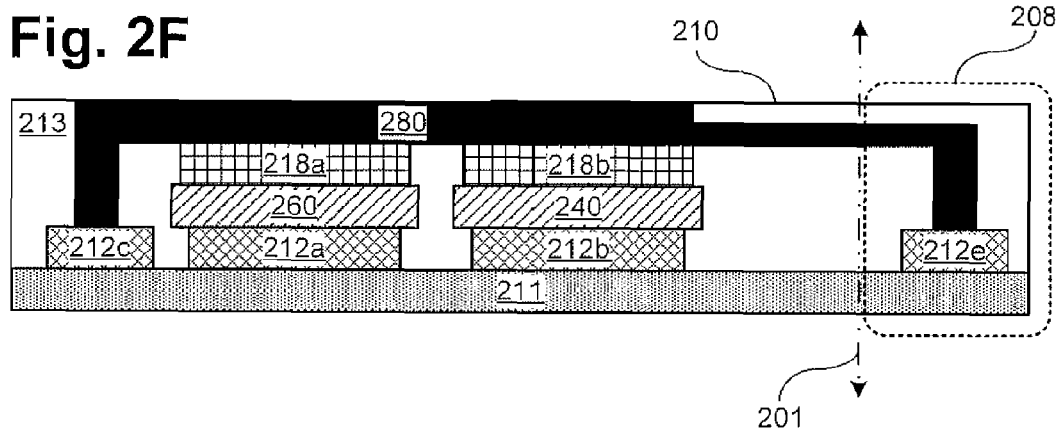
FIG. 2F illustrates a cross sectional view of a thermally enhanced semiconductor package with an exposed parallel conductive clip according to an embodiment of the invention.

With respect to FIG. 2F, FIG. 2F illustrates a cross sectional view of a thermally enhanced semiconductor package with an exposed parallel conductive clip according to an embodiment of the invention. Comparing FIG. 2F with FIG. 2E, a mold compound 213 is formed over control transistor 240, sync transistor 260, pad 212c, and pad 212e without covering a top surface of conductive clip 280 from FIG. 2E so as to form an exposed parallel conductive clip 280 in FIG. 2F. For example, the top surface of package 210 may be abutted against an inner wall of a top pocket of a mold used to shape mold compound 213. Additionally, FIG. 2F identifies region 208, corresponding to region 208b from FIG. 2C, and a cutting line 201, which is positioned at a point between control transistor 240 and outside pad 212e.

Figure 2G:
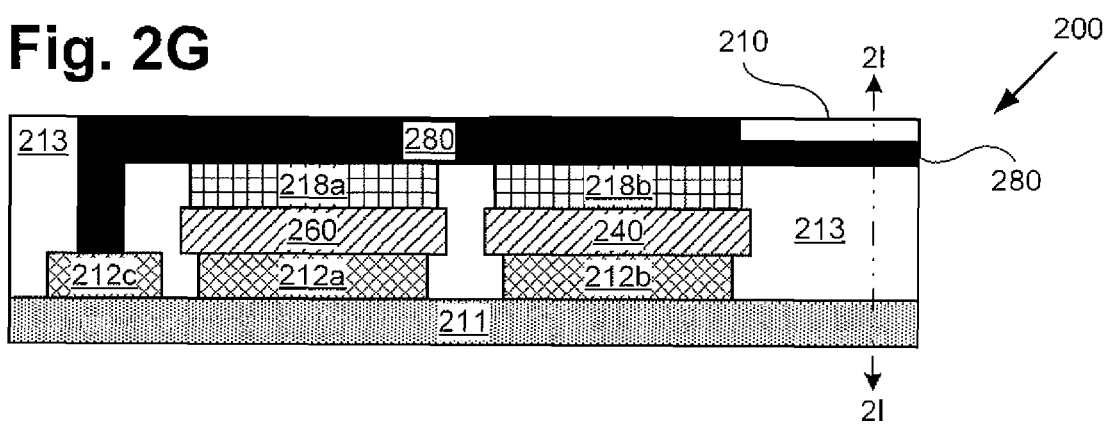
FIG. 2G illustrates a cross sectional view of a thermally enhanced semiconductor package with an exposed parallel conductive clip according to an embodiment of the invention.

Turning to FIG. 2G, FIG. 2G illustrates a cross sectional view of a thermally enhanced semiconductor package with an exposed parallel conductive clip according to an embodiment of the invention. Comparing FIG. 2G with FIG. 2F, package 210 of FIG. 2F is cut along cutting line 201 at one side to remove region 208. Package 210 of FIG. 2F may also be cut along cutting lines on the other three sides for full singulation, resulting in package 210 of FIG. 2G. As shown in FIG. 2G, the substantially parallel alignment of conductive clip 280 with substrate 211 is preserved while advantageously avoiding the larger package form factor conventionally required by pad 212e, as the supporting structure of conductive clip 280 coupled to pad 212e is removed during the singulation process.

Figure 2H:
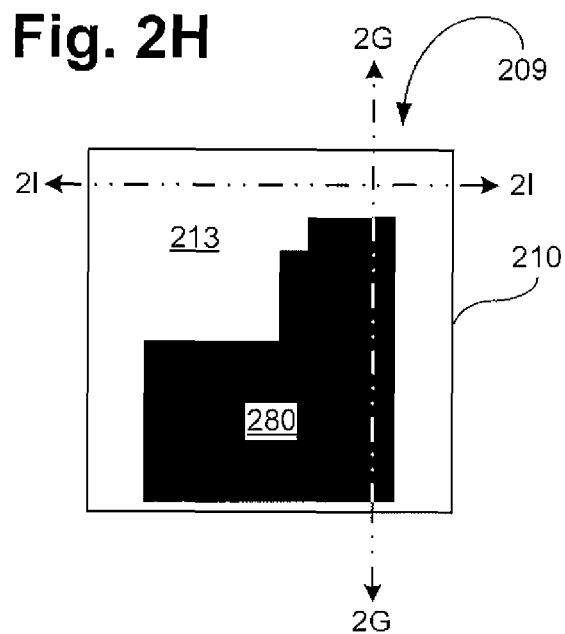
FIG. 2H illustrates a top view of a thermally enhanced semiconductor package with an exposed parallel conductive clip according to an embodiment of the invention.

With respect to FIG. 2H, FIG. 2H illustrates a top view of a thermally enhanced semiconductor package with an exposed parallel conductive clip according to an embodiment of the invention. The top view of FIG. 2H may correspond to a top view of package 210 from FIG. 2G. As shown in FIG. 2H, conductive clip 280 is substantially exposed at the top of package 210 without any flashing issues from mold compound 213. Additionally, the shape of conductive clip 280 may be configured such that the top surface of package 210 comprises substantially the top exposed surface of conductive clip 280, thereby maximizing the available surface area for thermal dissipation.

Comparing conductive clip 280 in FIG. 2H with conductive clip 180 in FIG. 1E and FIG. 1G, it can be seen that maintaining substantial parallel alignment between conductive clip 280 and substrate 211 results in the substantial exposure of conductive clip 280 at the top of package 210. Thus, compared to conventional packages, package 210 may be thermally enhanced as the top surface of conductive clip 280 is more reliably exposed to the outside of package 210. Additionally, a heat sink may be securely attached to the substantially flat exposed surface of conductive clip 280, further enhancing thermal dissipation.

FIG. 2H further identifies a cross sectional line indicated by line 2G-2G. Thus, the cross section shown in FIG. 2G may correspond to the cross sectional line indicated by line 2G-2G in FIG. 2H. As shown in FIG. 2H, the exposed top surface of conductive clip 280 does not extend to the edge of package 210 as a result of the half etching step from FIG. 2E, which may prevent accidental shorting and provide a uniform surface for heat sink mounting. If the half-etching step from FIG. 2E were omitted, then an exposed portion of conductive clip 280 would extend towards side 209 along line 2G-2G in FIG. 2H.

Figure 2I:
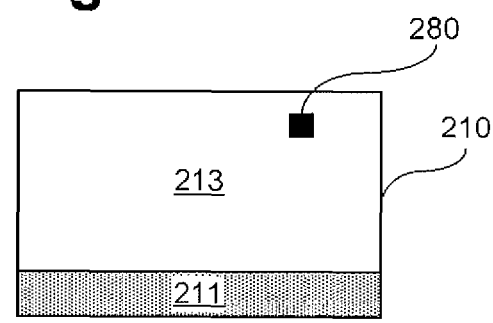
FIG. 2I illustrates a cross sectional view of a thermally enhanced semiconductor package with an exposed parallel conductive clip according to an embodiment of the invention.

Moving to FIG. 2I, FIG. 2I illustrates a cross sectional view of a thermally enhanced semiconductor package with an exposed parallel conductive clip according to an embodiment of the invention. The cross section shown in FIG. 2I may correspond to the cross sectional line indicated by line 2I-2I in FIG. 2G and line 2I-2I in FIG. 2H. Even if line 2I-2I in FIG. 2H is moved to the edge of package 210 at side 209, FIG. 2I still remains the same. Thus, it can be observed that a side surface of conductive clip 280 is also exposed at side 209 of package 210. However, since the exposed surface area of conductive clip 280 in FIG. 2I is small compared to the surface area of mold compound 213 at side 209, the exposed area of conductive clip 280 at side 209 may in most cases be safely ignored. However, an insulating material may also be applied to insulate the side surface of conductive clip 280 exposed at side 209.

Thus, an exposed parallel conductive clip for a thermally enhanced semiconductor package has been described. According to the present invention, by using an exposed parallel conductive clip 280 that is supported by at least one inside pad and at least one outside pad wherein the outside pad is removed during the singulation process, a thermally enhanced semiconductor package may be provided while optimizing package form factor compared to conventional packages.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A thermally enhanced semiconductor package comprising: a substrate housing at least one transistor; at least one inside pad; an exposed conductive clip coupled to said at least one inside pad and a terminal of said at least one transistor, said exposed conductive clip having a top surface and a side surface; a mold compound enclosing said at least one transistor and said at least one inside pad without covering said top surface of said exposed conductive clip; said side surface of said exposed conductive clip being exposed on one side of said mold compound, without exposing said at least one inside pad; said exposed conductive clip being substantially aligned and in parallel with said substrate.

2. The thermally enhanced semiconductor package of claim 1, wherein a portion of said exposed conductive clip extending to said one side of said mold compound is half-etched.

3. The thermally enhanced semiconductor package of claim 1, wherein said substrate further houses another transistor, wherein said exposed conductive clip is further coupled to a terminal of said another transistor.

4. The thermally enhanced semiconductor package of claim 3, wherein said substrate further houses a driver integrated circuit (IC), said driver IC driving said at least one transistor and said another transistor, wherein said package comprises a buck converter.

5. The thermally enhanced semiconductor package of claim 1, wherein said exposed conductive clip is coupled to said at least one transistor using solder.

6. The thermally enhanced semiconductor package of claim 1, wherein said exposed conductive clip comprises a copper clip.

7. The thermally enhanced semiconductor package of claim 1, further comprising a heatsink attached to said top surface of said exposed conductive clip.

8. The thermally enhanced semiconductor package of claim 1, wherein said package is a leadless package.

9. The thermally enhanced semiconductor package of claim 1, wherein said substrate is a leadframe.

10. The thermally enhanced semiconductor package of claim 1, wherein a top surface of said package substantially comprises said top surface of said exposed conductive clip.

11. A thermally enhanced semiconductor package comprising: a substrate housing at least one transistor; at least one inside pad; an exposed conductive clip coupled to said at least one inside pad and a terminal of said at least one transistor, said exposed conductive clip having a top surface and at least one side surface; a mold compound enclosing said at least one transistor and said at least one inside pad without covering said top surface of said exposed conductive clip; said at least one side surface of said exposed conductive clip being exposed on one side of said mold compound, without exposing said at least one inside pad.

12. The thermally enhanced semiconductor package of claim 11, wherein a portion of said exposed conductive clip extending to said one side of said mold compound is half-etched.

13. The thermally enhanced semiconductor package of claim 11, wherein said substrate further houses another transistor.

14. The thermally enhanced semiconductor package of claim 13, wherein said exposed conductive clip is further coupled to a terminal of said another transistor.

15. The thermally enhanced semiconductor package of claim 11, wherein said substrate further houses a driver integrated circuit (IC).

16. The thermally enhanced semiconductor package of claim 13, wherein said substrate further houses a driver integrated circuit (IC), said driver IC driving said at least one transistor and said another transistor, wherein said package comprises a buck converter.

17. The thermally enhanced semiconductor package of claim 11, wherein said package comprises a buck converter.

18. The thermally enhanced semiconductor package of claim 11, wherein said exposed conductive clip is coupled to said at least one transistor using solder.

19. The thermally enhanced semiconductor package of claim 11, further comprising a heatsink attached to said top surface of said exposed conductive clip.

20. The thermally enhanced semiconductor package of claim 11, wherein said package is a leadless package.

\* \* \* \* \*